United States Patent [19]

Gulick et al.

[11] Patent Number: 5,408,639

[45] Date of Patent: Apr. 18, 1995

[54] EXTERNAL MEMORY ACCESS CONTROL FOR A PROCESSING SYSTEM

[75] Inventors: Dale E. Gulick; James E. Bowles, both of Austin, Tex.

[73] Assignee: Advanced Micro Devices, Austin, Tex.

[21] Appl. No.: 917,489

[22] Filed: Jul. 21, 1992

[51] Int. Cl.⁶ .............................................. G06F 13/00
[52] U.S. Cl. .................................... 395/550; 395/750; 364/270.3; 364/270.6; 364/271.5; 364/DIG. 1
[58] Field of Search ................. 395/425, 700, 750, 550

[56] References Cited

U.S. PATENT DOCUMENTS

| 4,893,271 | 1/1990 | Davis et al. ........................ 395/550 |
| 5,155,480 | 10/1992 | Niijima .............................. 395/550 |

FOREIGN PATENT DOCUMENTS

| 0230960A2 | 8/1987 | European Pat. Off. . |
| 0230960A3 | 8/1987 | European Pat. Off. . |
| 0472285A2 | 2/1992 | European Pat. Off. . |
| 0472285A3 | 1/1993 | European Pat. Off. . |
| 63131616 | 3/1988 | Japan . |

OTHER PUBLICATIONS

IBM Technical Disclosure Bulletin, "Memory Controller Which Automatically Adjusts To Changes In System Clock Rate", vol. 32, No. 8A, pp. 265-266, Jan. 1990.

IBM Technical Disclosure Bulletin, "Programmable Memory Controller", vol. 31, No.9, pp. 351-353, Feb. 1989.

Primary Examiner—Robert L. Richardson
Attorney, Agent, or Firm—Johnson & Wortley

[57] ABSTRACT

A processing system of the type having a processor which accesses external memory for data and/or instructions which includes an improved external memory access control system for rendering the external memory enable time durations independent from the number of external memory accesses per unit of time for reducing power consumption of the processing system. The control system includes a selectably programmable clock for providing a clock signal of one of at least two speeds for determining the external memory access rate. The control system also includes enable duration control structure coupled to the selectably programmable clock. The enable duration control structure is arranged to enable the external memory for time durations during each memory access which are independent from the external memory access rate. Further, the enable duration control structure includes substructure for changing the duty cycle of external memory enable time duration control signals based upon the selected clock speed.

8 Claims, 5 Drawing Sheets

EXTERNAL MEMORY ACCESS CONTROL FOR A PROCESSING SYSTEM

CROSS-REFERENCE TO RELATED APPLICATIONS

This application is related to the following U.S. patent applications:

| SER. NO. | TITLE | INVENTOR(S) |
| --- | --- | --- |
| 07/569,935 | Improved External Memory Access Control for a Processing Unit | Gulick, et al. |
| 07/917,497 | General I/O Port Interrupt Mechanism | Gulick, et al. |
| 07/917,488 | Method of Weak Pull-up Disable and Mechanism Therefor for Use with Microcontroller in Integrated Circuit and Cordless Telephone Using the Integrated Circuit | Bowles, et al. |
| 07/917,503 | Interrupt Mask Disable Circuit and Method | Bowles, et al. |
| 07/918,627 | Integrated Circuit and Cordless Telephone Using the Integrated Circuit | Gulick, et al. |
| 07/918,626 | Modulator Test System | Peterson, et al. |
| 07/918,625 | Keypad Scanner Process and Device and Cordless Telephone Employing the Mechanism | Gulick |
| 07/918,624 | Serial Interface Module and Method | Gulick, et al. |
| 07/918,631 | Low Power Emergency Telephone Mode | Peterson, et al. |
| 07/918,623 | In-Circuit Emulation Capability Mode in Integrated Circuit and Cordless Telephone Using the Integrated Circuit | Gulick, et al. |
| 07/918,622 | Clock Generator Capable of Shut-down Mode and Clock Generation Method | Peterson, et al. |
| 07/918,621 | Signal Averager | Gulick |

All of the related applications, except for the first listed, are filed on even date herewith, are assigned to the assignee of the present invention, and are hereby incorporated herein in their entirety by this reference thereto. The first listed related application was filed on Aug. 20, 1990, is assigned to the Assignee of the present invention, and is also hereby incorporated herein in its entirety by this reference thereto.

BACKGROUND OF THE INVENTION

1. Field of the Invention

The present invention generally relates to processing systems and more particularly to processing systems wherein external memory accessing is required. Still more particularly, the present invention relates to an improved external memory access control for a processing system which reduces power consumption of the processing system by establishing external memory enable time durations which are independent from the external memory accessing rate.

2. Description of Related Art

As discussed in presently pending U.S. patent application Ser. No. 07/569,935, also entitled Improved External Memory Access Control for a Processing System, which application is assigned to the assignee of the present application, processing systems which include at least one microprocessor are well known in the art. In such processing systems, the microprocessor is generally required to access external memory for data and/or instructions. It is also common for microprocessor-based processing systems to have periods of high activity, wherein a large number of operations are performed per unit of time, interspersed with periods of low activity, wherein relatively few operations are performed per unit of time.

To reduce the power consumption of such processing systems during periods of low activity, it has been common in the prior art to reduce the external memory access rate of the microprocessor. This is typically accomplished through the use of either a variable-rate oscillator clock source or by incorporating into the microprocessor a clock divider circuit to reduce the external memory access rate. Since the microprocessor communicates with external memory through a bus, the external memory access rate may also be referred to as a bus access rate.

The foregoing prior art methods of reducing power consumption during low activity periods by reducing the external memory access rate have been generally effective with digital CMOS logic systems because the power consumption of digital CMOS logic systems is roughly proportional to the number of signal transitions occurring per unit of time. This is true because digital CMOS logic consumes the majority of its power when its internal and input signals are changing and, inversely, it consumes very little power when its internal signals are not changing.

Unfortunately, standard commercially available memory devices such as random access memory (RAM) devices and electrically programmable read only memory (EPROM) devices differ from digital CMOS logic in that these devices consume power whenever their enable inputs are held in the active state. The power consumption of such devices is therefore dependent upon the amount of time the memories are enabled (the amount of time the CHIP ENABLE signal is held active) in addition to the memory access rate (the frequency of transitions of the CHIP ENABLE signal). Although it is technically possible to provide RAM and EPROM devices which would consume power only when internal and external signals are in transition, these devices would be more complex and would not benefit from the economics of scale which result from providing one design for all applications.

In existing microprocessor-based processing systems, the CHIP ENABLE signal for external RAM and/or EPROM is decoded either within the microprocessor or by logic external to the microprocessor from bus control signals provided by the microprocessor. Typical bus control signals, as for example with respect to the 8031 class of microcontroller include the address lines, ALE, PSEN*, RD*, and WR*. The names and functions of the bus control signals differ from one microprocessor/microcontroller to another, but the fundamental concept of providing enabling and directional information to devices external to the microprocessor remains the same.

The limitation in the prior art to this application and those related thereto, with respect to low-power processing system operation, is that when the memory access rate of existing microprocessors and controllers is reduced in an attempt to save system power, the width of the bus control signals provided by the microprocessor (the external memory enable time durations) varies in direct proportion to the bus rate (external memory access rate) of the processor. As a result, even though the external memory access rate of the processor is reduced, the external memory enable time durations proportionately increase. Hence, the slower the memory access rate becomes, the longer the external memory enable time durations become. This is wasteful of system power since the external memory devices are enabled for a much longer time duration than is required to complete the accessing of the external memory devices.

U.S. patent application Ser. No. 07/569,935, identified above and incorporated herein by reference, provides a processing system which includes a processor which reduces the power consumption of standard commercially available memory devices which are not specifically designed for very low power. U.S. patent application Ser. No. 07/569,935 provides such a processing system by providing an external memory access control system which renders the external memory enable time durations independent from the number of external memory accesses per unit of time. Although the control system set forth in the related application is effective and useful generally, special characteristics arise in certain applications that can be exploited to create an even simpler control system. The present invention teaches such a control system that can be readily and simply constructed in situations wherein programmable clock speed is available.

SUMMARY OF THE INVENTION

The present invention provides an improved external memory access control system for use in a processing system of the type having a processor which accesses external memory for data and/or instructions. The improved external memory access control system according to the teachings of the present invention renders external memory enable time durations independent from the number of external memory accesses per unit of time for reducing power consumption of the processing system. The control system according to the teachings of the present invention includes a selectably programmable clock for providing a clock signal of one of at least two speeds for determining the external memory access rate. The control system also includes enable duration control structure coupled to the selectably programmable clock, which structure is arranged to enable the external memory for time durations during each memory access which are independent from the external memory access rate. Further, the enable duration control structure includes substructure for changing the duty cycle of external memory enable time duration control signals based upon the selected clock speed.

Accordingly, it is an object of the present invention to provide structure and a method for lowering power consumption for memory accesses at low frequency in processing systems.

Another object of the present invention is to provide structure and a method for conserving power in battery driven applications including a microcontroller.

Yet another object of the present invention is to provide structure and a method for simplifying and for improving the efficiency of certain processing systems.

BRIEF DESCRIPTION OF THE DRAWINGS

For a more complete understanding of the present invention, and for further objects and advantages thereof, reference may now be made to the following detailed description taken in conjunction with the accompanying drawings wherein.

DETAILED DESCRIPTION OF THE INVENTION

Figure 1:
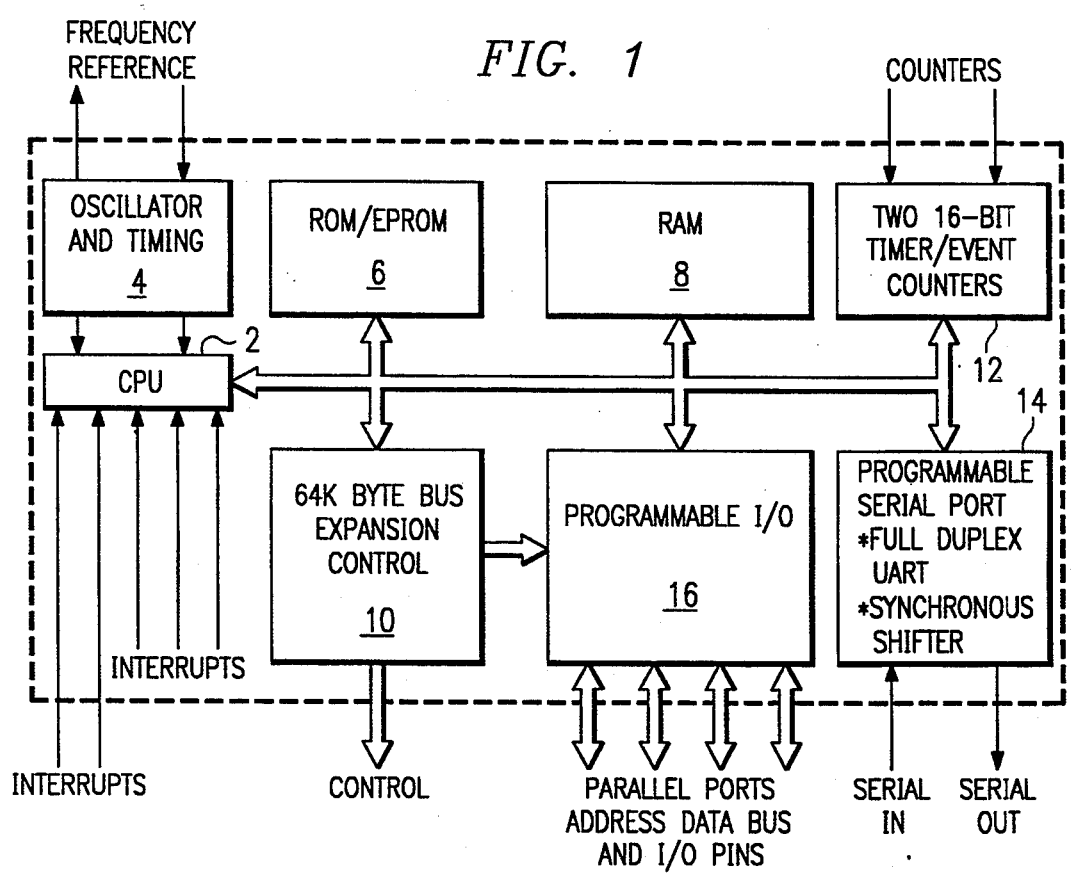
FIG. 1 is a block diagram of the general architectural structure of a microcontroller family.

Referring now to the drawings and, more particularly, to FIG. 1, there is shown a block diagram of the general architectural structure of the 8051 microcontroller family manufactured by the assignee of the present invention. Various aspects of this family of microcontrollers are discussed immediately below. Purposes of this discussion are to describe an environment in which the teachings of the present invention may usefully be applied and to provide general background as to operation of prior art microcontrollers; this discussion is not meant to be, nor should it in anyway be construed to be, limiting of the scope of the present invention.

With reference to FIG. 1, 8051 family products may be seen to include a CPU 2, an oscillator and timing circuit 4, a read-only memory/electrically programmable read-only memory ("ROM/EPROM") 6, a random access memory "RAM" 8, control circuitry 10, timer/-counters 12, programmable serial port 14, and programmable I/O 16.

All 8051 family devices have separate address spaces for program memory and data memory. The logical separation of program and data memory allows the data memory to be accessed by 8-bit addresses, which can be more quickly stored and manipulated by an 8-bit CPU. Nevertheless, 16-bit data memory addresses can also be generated through various special registers in various 8051 microcontroller devices.

In 8051 family products the program memory can only be read, not written to. There can be up to 64K bytes of program memory. Data memory occupies a separate address space from the program memory. Up to 64K bytes of external RAM can be addressed in the external data memory space. The CPU 2 generates read and write signals, RD* and WR*, as needed during external data memory in various 8051 family devices. The external program memory and external data memory can be combined by applying the RD* and PSEN* (program store enable) signals to the inputs of an AND gate and using the output of the gate as a read strobe to the external program/data memory.

The oscillator and timing circuitry 4 includes an oscillator which drives an internal clock generator, which provides the internal clocking signals to the chip. The internal clocking signals are at half the oscillator frequency, and define the internal phases, states, and machine cycles. A machine cycle consists of 6 states (12 oscillator periods). Each state is divided into a phase 1 half, during which a phase 1 clock is active, and a phase 2 half, during which a phase 2 clock is active. Thus, a machine cycle consists of 12 oscillator periods. Each phase lasts for one oscillator period. Each state lasts for two oscillator periods. Typically, arithmetic and logical operations take place during phase 1 and internal register-to-register transfers take place during phase 2.

All four ports shown connected to programmable input/output circuitry 14 in FIG. 1 are bi-directional. Each port consists of a latch (special function registers P0 through P3), an output driver, and an input buffer. The output drivers of Ports 0 and 2, and the input buffers of Port 0, are used in accesses to external memory. In this application, Port 0 outputs the low byte of the external memory address, time-multiplexed with the byte being written or read. Port 2 outputs the high byte of the external memory address when the address is 16 bits wide. Otherwise, the Port 2 pins continue to emit the P2 special function register ("SFR") contents. All the Port 3 pins (and, in certain cases, two of the Port 1 pins) are multi-functional. They are not only Port pins, but also serve various special functions such as timer/counter external input and timer/counter capture/reload trigger.

With respect to accessing external memory, in 8051 family devices access to external memory are of two types: accesses to external program memory and accesses to external data memory. Accesses to external program memory use a signal PSEN* (program store enable) as the read strobe. Accesses to external data memory use RD* external data memory read strobe) or WR* (external data memory write strobe) to strobe the memory. Fetches from external program memory always use a 16-bit address. Accesses to external data can use either a 16-bit address or an 8-bit address. Whenever a 16-bit address is used, the high byte of the address comes out on Port 2, where it is held for the duration of the read or write cycle. It should be noted that the Port 2 drivers use strong pull-ups during the entire time that they are emitting address bits that are 1's. During this time the Port 2 latch (the special function register) does not have to contain 1's, and the contents of the Port 2 SFR are not modified. If the external memory cycle is not immediately followed by another external memory cycle, the undisturbed contents of the Port 2 SFR will reappear in the next cycle. If an 8-bit address is used, the contents of the Port 2 SFR remain at the Port 2 pins throughout the external memory cycle. This facilitates paging. In any case, the low byte of the address is time-multiplexed with the data byte on Port 0. An ADDR-/data signal drives two field-effect transistors in the Port 0 output buffers. Thus, in such applications, the Port 0 pins are not open drain outputs, and do not require external pullups. Signal ALE (address latch enable) is used to capture the address byte into an external latch. The address byte is valid at the negative transition of ALE. Then, in a write cycle, the data byte to be written appears on Port 0 just before WR* is activated, and remains there until after WR* is deactivated. In a read cycle, the incoming byte is accepted at Port 0 just before the read strobe is deactivated.

During any access to external memory, the CPU 2 writes 0FFH to the Port 0 latch (the special function register), thus obliterating whatever information the Port 0 SFR may have been holding.

External program memory is accessed under two conditions: (1) whenever signal EA* is active; or (2) whenever the program counter ("PC") contains a number that is larger than 0FFFH (1FFFH for certain family members). This requires that ROMless versions have EA wired low to enable the lower 4K (or 8K for various family members) programmed bytes to be fetched from external memory. When the CPU is executing out of external program memory, all 8 bits of Port 2 are dedicated to an output function and may not be used for general purpose I/O. During external program fetches they output the high byte of the PC. During this time the Port 2 drivers use the strong pullups to emit PC bits that are 1's.

The read strobe for external fetches is PSEN*, which is not activated for internal fetches. When the CPU is accessing external program memory, PSEN* is activated twice every cycle (except during a move carry bit or "MOVX" instruction) whether or not the byte fetch is actually needed for the current instruction. When PSEN* is activated, its timing is not the same as RD*. A complete RD* cycle, including activation and deactivation of ALE and RD*, takes 12 oscillator periods. A complete PSEN* cycle, including activation and deactivation of ALE and PSEN*, takes 6 oscillator periods.

The main function of ALE is to provide a properly timed signal to latch the low byte of an address from P0 to an external latch during fetches from external program memory. For that purpose, ALE is activated twice every machine cycle. This activation takes place even when the cycle involves no external fetch. The only time an ALE pulse does not come out is during an access to external data memory. The first ALE of the second cycle of an MOVX instruction is missing. Consequently, in any system that does not use external data memory, ALE is activated at constant rate of 1/6th the oscillator frequency, and can be used for external clocking or timing purposes.

In some applications it is desirable to execute a program from the same physical memory that is being used to store data. In the 8051 family, the external program and data memory spaces can be combined by ANDing PSEN* and RD*. A positive-logic AND of these two signals produces an active-low read strobe that can be used for the combined physical memory. Since the PSEN* cycle is faster than the RD* cycle, the external memory needs to be fast enough to accommodate the PSEN* cycle.

The 8051 family devices have two 16-bit timer/counter registers: timer 0 and timer 1. Certain family members also have one more: timer 2. All such timers can be configured to operate either as timers or event counters. When performing a "timer" function, the register is incremented every machine cycle. Thus, one can think of it as counting machine cycles. Since the machine cycle consists of 12 oscillator periods, the count rate is 1/12th of the oscillator frequency. When performing a "counter" function, the register is incremented in response to a 1-to-0 transition at its corresponding external input pin, T0, T1 or T2. In this function, the external input is sampled during part of every machine cycle. When the samples show a high in 1 cycle, and a low in the next cycle, the count is incremented. The new count value appears in the register during a part of the cycle following the one in which the transition was detected. Since it takes 2 machine cycles (24 oscillator periods) to recognize a 1-to-0 transition, the maximum count rate is 1/24th of the oscillator frequency. There are no restrictions on the duty cycle of the external input signal, but to ensure that a given level is sampled at least once before it changes, it should be held for at least one full machine cycle. In addition to the "timer" or "counter" selection, timer 0 and timer 1 have four operating modes from which to select. Putting either timer into mode 0 makes it look like an 8-bit counter with a divided-by-32 prescaler. Mode 1 is the same as mode 0, except that the timer register is being run with all 16 bits. Mode 2 configures the timer register as an 8-bit counter with automatic reload. A timer in mode 3 simply holds its count.

Figure 2:
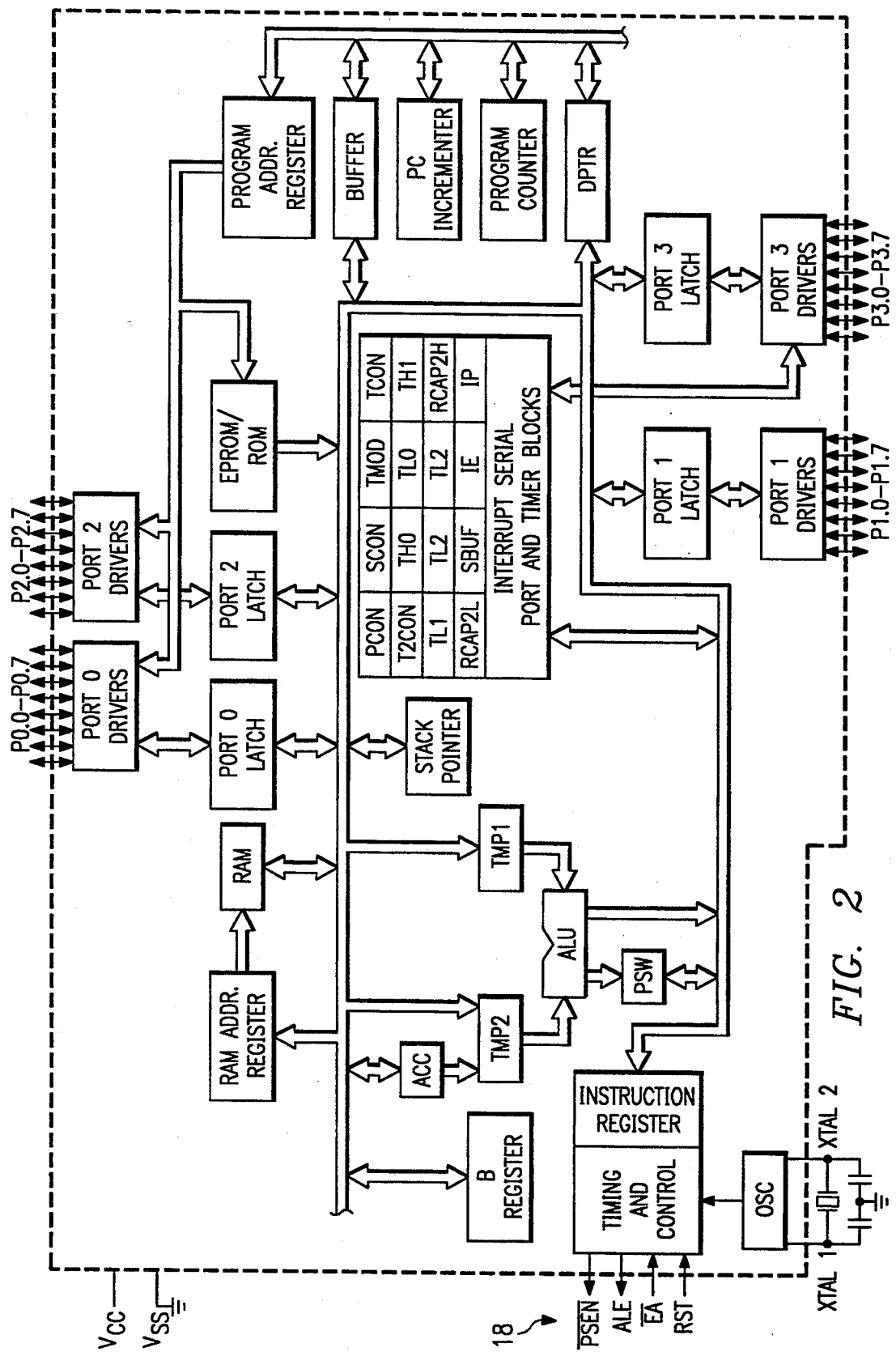
FIG. 2 is a more detailed block diagram of the general structure of the microcontroller family shown in FIG. 1.

Referring now to FIG. 2, there is shown a more detailed block diagram of the general structure of the microcontroller family shown in FIG. 1. FIG. 2 is especially noteworthy with respect to the present invention, because it depicts the aforementioned PSEN* signal (designated by reference numeral 18), which signal can play an important role in embodiments of the present invention, as the discussion below will further make clear.

Figure 3:
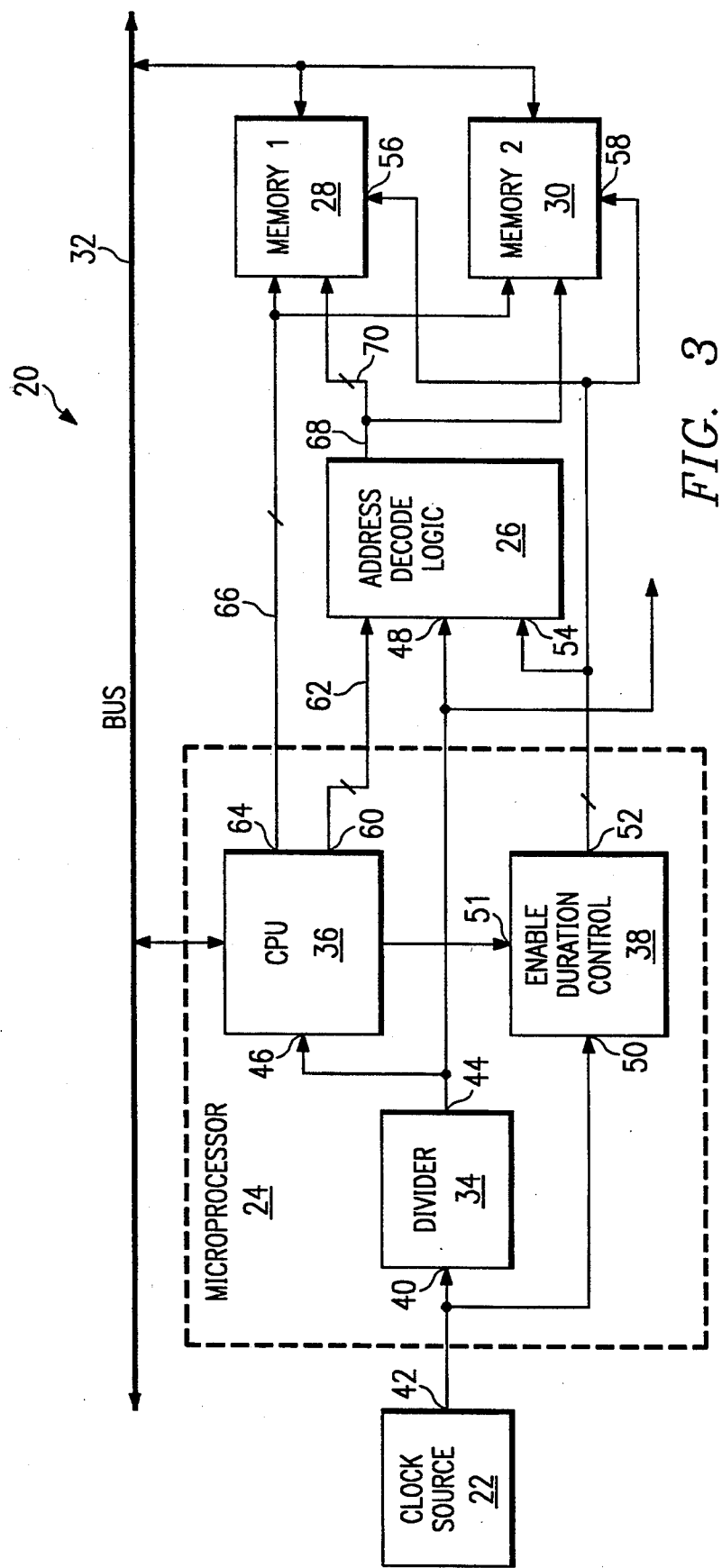
FIG. 3 is a block diagram of a processing system embodying the invention of related U.S. patent application Ser. No. 07/569,935.

At this point, to even further facilitate understanding an appreciation of the present invention, it is helpful and appropriate to review the teachings of related U.S. patent application Ser. No. 07/569,935, from which the present invention was derived. Referring then to FIG. 3, there is illustrated, in block diagram form, a processing system 20 embodying the invention disclosed and claimed in related U.S. patent Ser. No. 07/569,935. The processing system 20 generally includes a clock source 22, a microprocessor 24, address decode logic 26, a first memory 28, a second memory 30, and a bus 32. In the embodiment shown in FIG. 3, the clock source 22, address decode logic 26, the first memory 28, and the second memory 30, are all external to the microprocessor 24. Also, the clock source 22, the microprocessor 24, address decode logic 26, the first memory 28 and the second memory 30 may all be implemented in integrated circuit form with each being contained within separate integrated circuit devices.

The microprocessor 24 depicted in FIG. 3 includes a divider circuit 34, a central processing unit 36, and an enable duration control 38. The divider circuit 34 has an input 40 coupled to the output 42 of the clock source 22 for receiving the clock output of the clock source 22. The divider 34 also has an output 44 which is coupled to a clock input 46 of the central processing unit 36 and a clock input 48 of the address decode logic 26. The clock source 22 provides a clock output comprising a relatively high frequency pulse train which is divided by the divider circuit 34 to provide at its output 44 timing and synchronizing clock signals for the processing system. As taught in the related U.S. patent application Ser. No. 07/569,935, the output frequency of the clock signal provided by the divider 34 at its output 44 determines the external memory access rate by the microprocessor 24.

The enable duration control 38 includes an input 50 which is coupled between the output 42 of the clock source 22 and the input 40 of the divider circuit 34. In accordance with the teachings in the related application Ser, No. 07/569,935, the enable duration control provides at its output 52 external memory enable time duration signals which determine the time in which the external memories are enabled for utilizing the bus during each access of the external memories by the microprocessor 24. As will also be seen hereinafter, the enable time durations established by the enable duration control 38 are independent from the external memory access rate determined by the divider 34. The enable duration control 38 also includes an input 51 coupled to the central processing unit 36. This input allows the central processing unit 36 to control when the enable time durations established by the enable duration control begin, but synchronized to the clock source output.

The output 52 of the enable duration control 38 comprises a plurality of lines denoted by the hash mark, which lines are coupled to bus enable control inputs 54 of the address decode logic 26, the bus enable inputs 56 of the first external memory 28, and the bus enable inputs 58 of the second external memory 30. As will be appreciated by those skilled in the art, the output 52 of the enable duration control 38 may be coupled to the address decode logic and external memories as illustrated in FIG. 3, may be coupled directly and only to the external memories 28 and 30, or may be coupled to the external memories 28 and 30 only through the address decode logic, depending upon the particular processing system design and without departing from the invention of the related U.S. patent application Ser. No. 07/569,935.

The central processing unit 36 includes a first output 60 for providing a first set of external memory addresses to the address decode logic 26 over a first plurality of lines 62. The central processing unit 36 also includes a second output 64 for providing a second set of external memory addresses to the external memories 28 and 30 over a second plurality of output lines 66. When the microprocessor 24 accesses an external memory, the first set of addresses are decoded by the address decode logic for the purpose of selecting the external memory to be accessed. To that end, the address decode logic includes an output 68 which is coupled to the first and second memories 28 and 30 over a plurality of output lines 70 for conveying to the external memories 28 and 30 external memory or chip select signals.

The second set of addresses provided by the central processing unit 36 are utilized for selecting the desired memory location within the external memory to be accessed. Each of the memories 28 and 30 preferably includes a plurality of memory locations with each memory location having a unique address with respect to its memory. The memory address locations of the external memories may have duplicated addresses. Hence, the chip select signals provided by the address decode logic 26 over lines 70 select the memory to be accessed and the second set of memory addresses conveyed over lines 66 select the particular memory location to be accessed within the selected external memory to be accessed.

As may also be noted in FIG. 3, the central processing unit 36 is coupled to the bus 32 and the external memories 28 and 30 are also coupled to the bus 32. The central processing unit 36 and external memories 28 and 30 are coupled to the bus 32 to enable the microprocessor 24 to communicate with the external memories to permit the central processing unit to read data and/or instructions from the external memories or to write data into the external memories during external memory accesses.

Continuing to refer to FIG. 3, in operation, as the central processing unit 36 of the microprocessor 24 performs executions of instructions, the central processing unit must access the external memories 28 and 30 to read data or instructions from the external memories or to write data to the external memories. The clock source 22 provides at its output 42 a clock output in the form of a relatively high frequency pulse train from which the external memory access rate is derived. The external memory access rate is derived from the output 44 of the divider 34. In the particular system shown in FIG. 3, the frequency of the clock source defines the maximum access rate of the external memories by the microprocessor. During times of high microprocessor activity, the divider 34 will divide the clock rate of the clock output provided by the clock source 22 by a factor of one. During period of low microprocessor activity, the access rate is reduced to conserve power and the divider will then divide the clock rate of the clock output provided by the clock source 22 by a factor of thirty-two, for example.

The clock signal provided at the output 44 of the divider 34 thus determines the external memory access rate of the microprocessor and is also used for other timing and synchronizing purposes within the processing system 20. The enable duration control 38 establishes the time duration in which the external memories are enabled during each external memory access and is also responsive to the central processing unit 36 for beginning the memory enable time durations at the proper time.

Figure 4A:
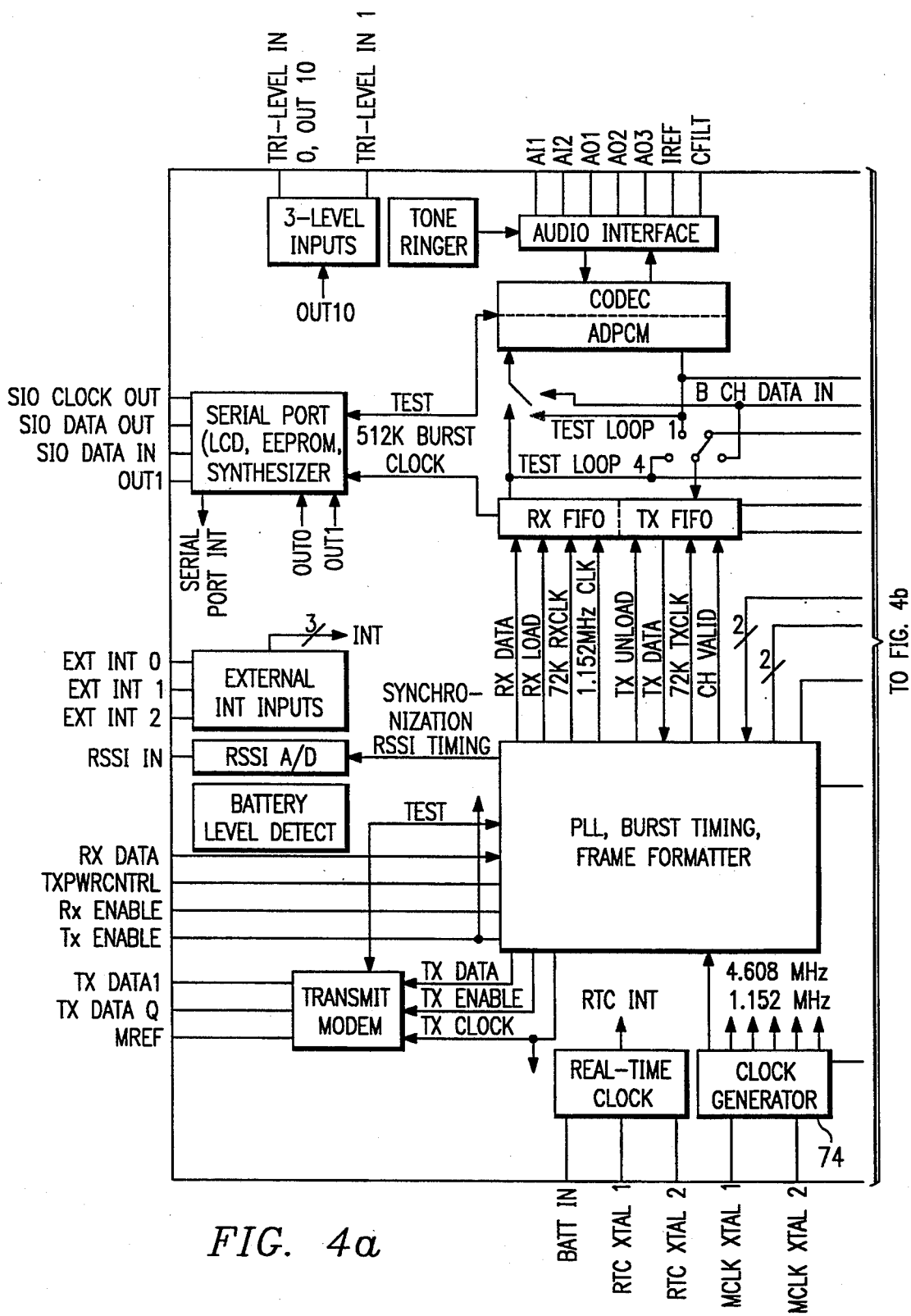
FIG. 4 (which consists of FIGS. 4a and 4b) is a block diagram of an integrated circuit including an improved external memory access control system according to the teachings of the present invention.
Figure 4B:
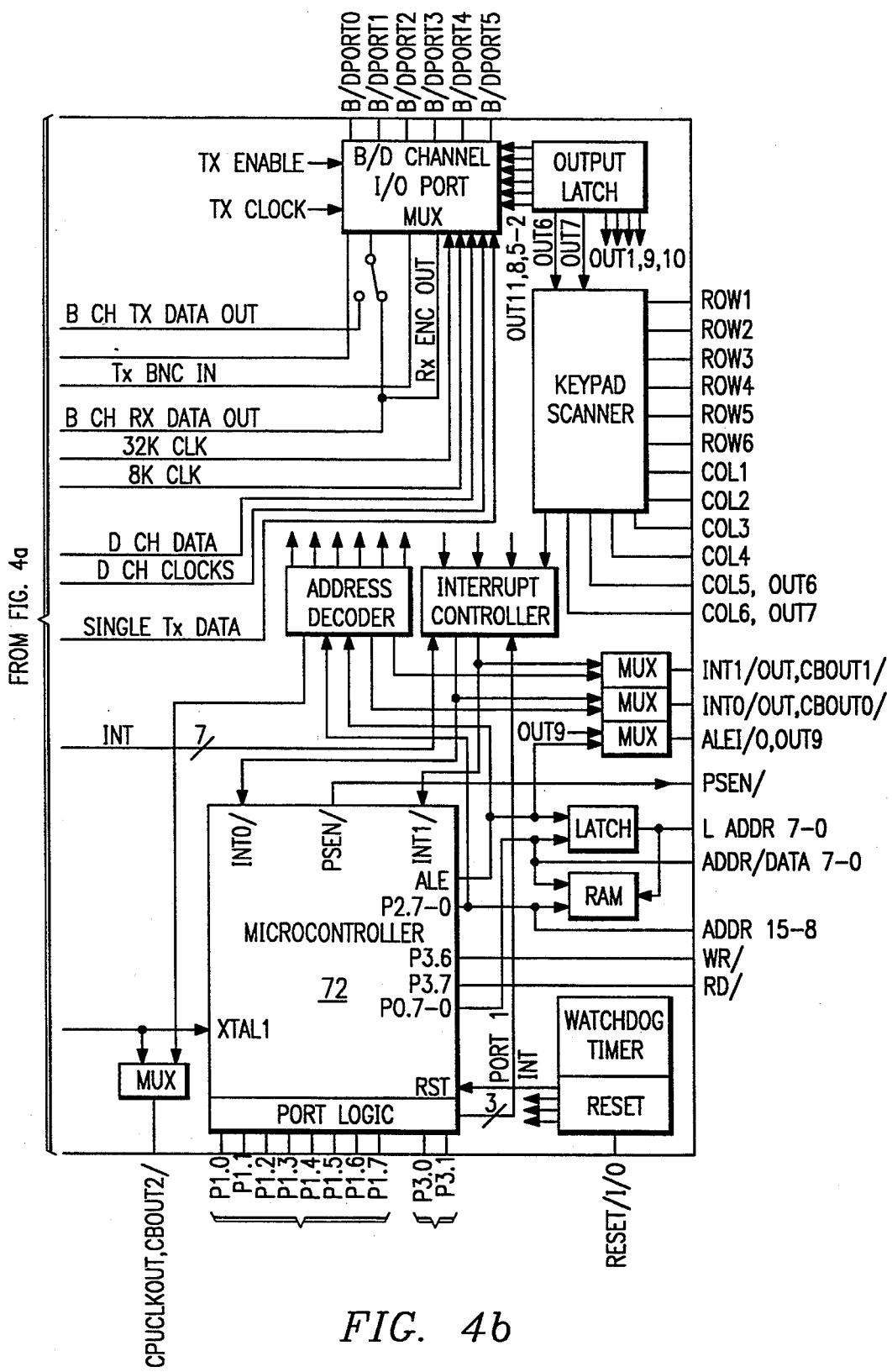

Referring now to FIG. 4, there is shown a block diagram of an integrated circuit including an improved external memory access control system according to the teachings of the present invention. The integrated circuit shown in FIG. 4 comprises a multitude of subelements; each of these subelements, their interconnection, and their interoperation are all discussed at length in various of the related cases whose descriptions have all been incorporated herein. For purposes of describing the instant invention, significant elements are microcontroller 72 and clock generator 74.

The microcontroller 72 is generally a 8051 type microcontroller as described above. In an actually constructed embodiment of the present invention that has been tested with superb results, the microcontroller 72 was actually an 8-bit microcontroller providing the functions of the 80C32T2 member of the AMD 80C51 family of products. Details regarding this particular product are well known to those skilled in the art and are also readily available.

The clock generator 74 comprises a crystal oscillator, a power mode control, a module enable control, and clock dividers for the IC shown in FIG. 4. In the actually constructed embodiment of the present invention, the microcontroller clock has a programmable divider with an input of 18.432 MHz. The programmable rates are divided by 2, 4, 8, 16, 31, 64, 128, and 256. Other details regarding the clock, which details are not particularly relevant to the instant application, are set forth in various of the related applications.

According to the teachings of the present invention, the duty cycle of the external memory enable time duration control signals may be changed based upon a selected clock speed, to thereby render the external memory enable time durations independent from the number of external memory accesses per unit of time. This, in turn, reduces processor power consumption, which is a positive development. With special reference to the 8051 or similar microcontrollers, according to the teachings of the present invention, the PSEN* signal could be made to be, for example, 2 or 3 oscillators depending on the frequency of the 80C321 microcontroller 72. Further, this duty cycle may be automatically adjusted depending upon the programmed frequency of the microcontroller.

The integrated circuit shown in FIG. 4 is ideally suited for incorporation therein of an embodiment of the present invention because it has a readily programmable clock speed because of the presence and operation of the clock generator 74. Based upon the clock generator programmed clock speed, which can be readily monitored, automatic selection of an appropriate PSEN* duty cycle may be made to effect the power consumption savings described. Those skilled in the art should appreciate that the 8051 does not inherently have a programmable clock speed, but it should also be appreciated how simply and effectively for the purpose of this invention such a feature could be added to such a microcontroller. FIG. 4 shows but one example of how this can be done.

The present invention therefore provides a new and improved external memory access control for use in a processing system which not only enables the external memory access rates to be reduced during periods of low microprocessor activity to thus reduce power consumption of the processing system, but in addition, also shortens the external memory enable time durations during each memory access during those periods when the external memory access rate is reduced. This further contributes to reduce the power consumption of the processing system which may be exceedingly important when such processing systems are powered by depletable power sources such as batteries. Preferably, and in accordance with the preferred embodiments described herein, the duty cycle of a PSEN* signal may be changed based upon a selected, programmable clock speed.

Obviously, numerous modifications and variations are possible in view of the above teachings. Accordingly, within the scope of the appended claims, the present invention may be practiced otherwise than as specifically described herein.

What is claim is:

1. In a processing system of the type having a processor which accesses external memory for data and/or instructions, an improved external memory access control system for rendering the external memory enable time durations independent from the number of external memory accesses per unit of time for reducing power consumption of said processor, said control system comprising:

selectably programmable clock means for providing a clock signal of one of at least two speeds for determining said number of external memory accesses per unit of time; and enable duration control means coupled to said clock means and being arranged to provide said external memory with external memory enable time duration control signals for establishing external memory enable time durations which are independent from said number of external memory accesses per unit of time, said enable duration control means comprising means for changing the duty cycle of external memory enable time duration control signals based upon the selected clock speed.

2. A control system as recited in claim 1, wherein said selectably programmable clock means comprises a clock which generates timing signals at a clock speed, and wherein said selectably programmable clock means further comprises means for changing said clock speed.

3. A control system as recited in claim 2, wherein said enable duration control means comprises means for monitoring said clock speed, which means for monitoring produces an output, and wherein said enable duration control means further comprises means for providing said external memory with external memory enable time duration control signals based upon said output of said means for monitoring.

4. A control system as recited in claim 1, wherein said processing system comprises a microcontroller, and wherein said external memory enable time duration control signals comprise program store enable signals having possibly varying duty cycles.

5. In a processing system of the type having a processor which accesses external memory for data and/or instructions, an improved external memory access control method for rendering the external memory enable time durations independent from the number of external memory accesses per unit of time for reducing power consumption of said processor, said method comprising the steps of:

providing a clock signal of one of at least two speeds for determining said number of external memory accesses per unit of time; and providing said external memory with external memory enable time duration control signals for establishing external memory enable time durations which are independent from said number of external memory accesses per unit of time, such provision effected by changing the duty cycle of external memory enable time duration control signals based upon the selected clock speed.

6. A method as recited in claim 5, wherein said step of providing a clock signal of one of at least two speeds comprises the steps of generating timing signals at a clock speed and changing said clock speed.

7. A method as recited in claim 6, wherein said step of providing said external memory with external memory enable time duration control signals comprises the step of monitoring said clock speed, which step produces an output, and wherein said step of providing said external memory with external memory enable time duration control signals further comprises the step of providing said external memory with external memory enable time duration control signals based upon said output of said means for monitoring.

8. A method as recited in claim 5, wherein said processing system comprises a microcontroller, and wherein said external memory enable time duration control signals comprise program store enable signals having possibly varying duty cycles.

* * * * *